Jan. 6, 1959 J. L. BUIE 2,867,695

TEMPERATURE-COMPENSATED DIRECT CURRENT TRANSISTOR AMPLIFIER

Filed April 12, 1954

JAMES L. BUIE
*INVENTOR.*

BY Bruce F. Birchard

HIS ATTORNEY

United States Patent Office 2,867,695

Patented Jan. 6, 1959

2,867,695

TEMPERATURE-COMPENSATED DIRECT CURRENT TRANSISTOR AMPLIFIER

James L. Buie, Sun Valley, Calif., assignor to Hoffman Electronics Corporation, a corporation of California Application April 12, 1954, Serial No. 422,484

9 Claims. (Cl. 179—171)

This invention is related to amplifier circuits employing transistors and, more particularly, to an improved transistor amplifier which will exhibit uniform characteristics irrespective of changes in temperature.

In the past many attempts have been made to design amplifiers employing transistors. Invariably certain problems are encountered which render transistor amplifiers presently in use deficient in some respect. The principal difficulty lies in the fact that conventional transistor amplifiers do not incorporate a means to compensate for changes in temperature, or if incorporating such a means, the amplifier circuitry becomes involved and cumbersome, resulting in excessive power consumption and increased cost of circuit manufacture.

Therefore, it is an object of this invention to provide an improved transistor amplifier circuit exhibiting neither base nor emitter current in the absence of an input signal.

It is a further object of this invention to provide an improved transistor circuit which will incorporate temperature compensating means and yet will be of simple design and will be inexpensive to manufacture, and will exhibit a minimum power loss.

According to this invention, a D. C. amplifier employs two conventional junction-type transistors so inter-connected that the temperature-dependent collector cut-off current of one transistor balances out the corresponding collector cut-off current of the other transistor in order that an input signal will produce an output signal which is independent of temperature.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
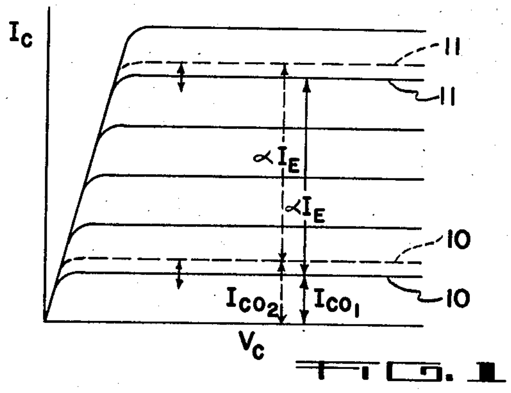
Figure 1 is a graphical representation of the characteristic curves of a junction-type transistor employed in this invention.
Figure 2:
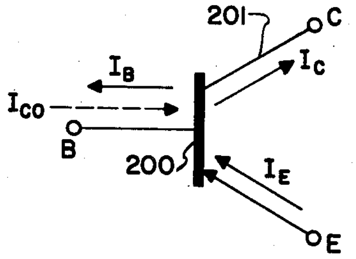
Figure 2 is a schematic representation of a junction-type P–N–P transistor employed in this invention.

The inter-relation of Figure 1 and Figure 2 is such as to warrant their simultaneous consideration. Figure 1 demonstrates the collector characteristic curves of the transistor shown in Figure 2. From Figure 2 it is apparent that $$I_E=I_B+I_C \tag{1}$$

where $I_E$ is emitter current, $I_B$ is base current, and $I_C$ is collector current. If the emitter circuit is open, collector cut-off current ($I_{CO}$) will still flow between base 200 and collector 201. It may be demonstrated empirically that the current amplification factor ($\alpha$) of junction transistors is relatively constant and is independent of temperature over a wide range of transistor operation. Thus:

$$\alpha=\left.\frac{\partial I_C}{\partial I_E}\right|_{V_C}=\text{a constant} \tag{2}$$

Further, it may be shown that the collector current is equal to the collector cut-off current ($I_{CO}$) plus an amount which is the emitter current ($I_E$) multiplied by the current amplification factor ($\alpha$) (see Figure 1). Thus:

$$I_C=I_{CO}+\alpha I_E \tag{3}$$

It has been found that $I_{CO}$ is responsive to changes in temperature whereas $\alpha I_E$ is not. Thus, in Figure 1, curve 10 may move up or down with respect to the $V_C$ axis as the transistor temperature changes, but the difference in magnitude between curve 11 and curve 10, i. e., $\alpha I_E$, will not change, at any given $V_C$ operating point. From Equations 1 and 3 it follows that $$I_B=(1-\alpha)I_E-I_{CO} \tag{4}$$

But since from Equation 3

$$I_E=\frac{I_C-I_{CO}}{\alpha} \tag{5}$$

it follows from Equation 4 that $$I_B=(1-\alpha)\left(\frac{I_C-I_{CO}}{\alpha}\right)-I_{CO} \tag{6}$$

or $$I_B=\left(\frac{1-\alpha}{\alpha}\right)I_C-\frac{I_{CO}}{\alpha} \tag{7}$$

If $I_B$ were equal to zero as would be the case with the base circuit, open, then from Equation 7

$$\left(\frac{1-\alpha}{\alpha}\right)I_C=\frac{I_{CO}}{\alpha} \tag{8}$$

or $$I_C=\frac{I_{CO}}{1-\alpha} \tag{9}$$

Figure 3:
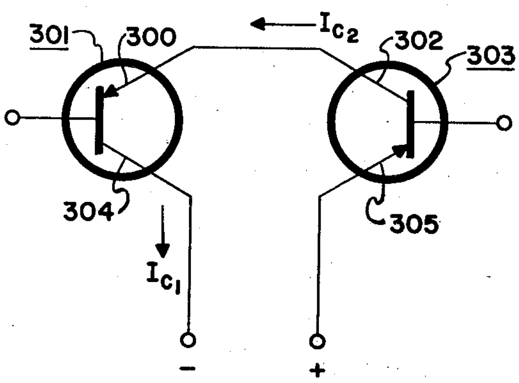
Figure 3 is a simplified circuit diagram of a D. C. amplifier employing transistors according to this invention.

In Figure 3, emitter 300 or transistor 301 is connected to collector 302 of transistor 303. The base circuits of transistors 301 and 303 are open. Collector 304 of transistor 301 is negative with respect to emitter 305 of transistor 303.

The circuit of Figure 4 operates as follows. By virtue of the open base circuits, it is apparent that $I_{C1}$ equals $I_{C2}$, and it follows from Equation 9 that $$\frac{I_{CO_1}}{1-\alpha_1}=\frac{I_{CO_2}}{1-\alpha_2} \tag{10}$$

Figure 4:
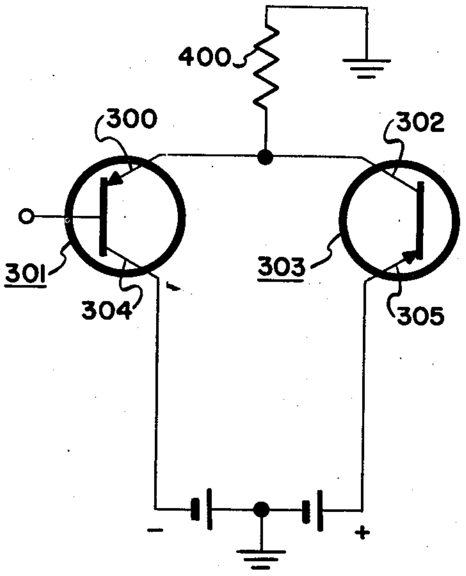
Figure 4 is a schematic diagram of an extension of the circuit shown in Figure 3.

Theoretically, then, if a bridge resistor 400 be added to the simplified circuit of Figure 3, as shown in Figure 4, there will be no current flowing through resistor 400, assuming that the collector potential of transistor 301 is equal in magnitude and opposite in polarity to the emitter potential of transistor 303, by reason of the circuit's bridge character. The circuit of Figure 4 simulates the condition when there is no input signal, i. e., theoretically there will be no load current in the absence of an input signal.

Figure 5:
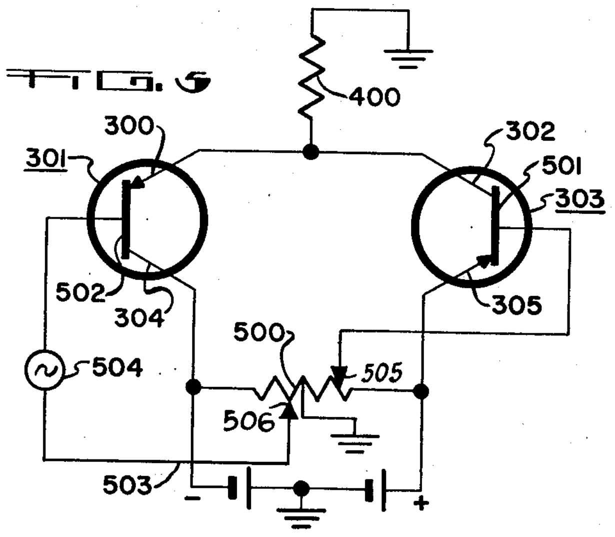
Figure 5 is a schematic diagram of a complete D. C. transistor amplifier according to this invention.

For the further refinement shown in Figure 5, potentiometer 500 is added between collector 304 of transistor 301 and emitter 305 of transistor 303. A potential is tapped from potentiometer 500 by means of tap 505 for application to base 501 of transistor 303 to control the collector current of transistor 303 and assure a balancing out of the emitter current of transistor 301 passing through resistor 400. A small negative voltage is also taken from potentiometer 500 by means of tap 506 and wire lead 503 and is applied to base 502 such that by the simultaneous adjustment of both taps of potentiometer 500, both the load current and the base current of transistor 301 may be made zero in the absence of an input signal.

The over-all current gain of the amplifier circuit shown in Figure 5 will now be considered. If the base current of transistor 301 is initially zero and the load current ($i_L$) through resistor 400 is initially zero, then the presence of a signal current, $i_s$, will satisfy the following relationship:

$$i_s=\left(\frac{1-\alpha}{\alpha}\right)i_c-\frac{I_{CO}}{\alpha} \quad (11)$$

from Equation 7, where $i_c$ is the total instantaneous collector current of transistor 301; or $$\frac{\alpha i_s}{1-\alpha}=i_c-\frac{I_{CO}}{1-\alpha} \quad (12)$$

which is to say $$\left(\frac{\alpha}{1-\alpha}\right)i_s=i_c-I_{C(\text{initial})}=i_L \quad (13)$$

since $I_{C(\text{initial})}$ is balanced out in resistor 400 by $I_C$ of transistor 303. Therefore $$I_{\text{gain}}=\frac{i_L}{i_s}=\frac{\alpha}{1-\alpha} \quad (14)$$

and consequently, the current gain is independent of temperature since the temperature dependent component $I_{CO}$ does not appear in Equation 14.

If there is present a base current ($I_B$) in transistor 301 in the absence of an input signal, it may be shown that the current-gain expression $$\frac{\alpha}{1-\alpha}$$

remains the same, assuming that the load current is initially zero.

$$I_B+i_s=\frac{1-\alpha}{\alpha}-\frac{I_{CO}}{\alpha} \text{ (from Equation 7)} \quad (15)$$

$$\frac{\alpha}{1-\alpha}(I_B+i_s)=i_c-\frac{I_{CO}}{1-\alpha} \quad (16)$$

$$\left(\frac{\alpha}{1-\alpha}\right)I_B+\left(\frac{\alpha}{1-\alpha}\right)i_s=i_c-\frac{I_{CO}}{1-\alpha} \quad (17)$$

$$I_B=\left(\frac{1-\alpha}{\alpha}\right)I_{C(\text{initial})}-\frac{I_{CO}}{\alpha} \text{ (from Equation 7)} \quad (18)$$

$$\left(\frac{\alpha}{1-\alpha}\right)I_B=I_{C(\text{initial})}-\frac{I_{CO}}{1-\alpha} \quad (19)$$

$$I_{C(\text{initial})}-\frac{I_{CO}}{1-\alpha}+\frac{\alpha}{1-\alpha}i_s=i_c-\frac{I_{CO}}{1-\alpha} \quad (20)$$

$$\frac{\alpha}{1-\alpha}i_s=i_c-I_{C(\text{initial})}=i_L \quad (21)$$

$$I_{\text{gain}}=\frac{i_L}{i_s}=\frac{\alpha}{1-\alpha} \quad (22)$$

Defining current-gain in Equations 14 and 22 as $$\frac{i_L}{i_s}$$

where $i_L$ is the instantaneous value of the load current and $i_s$ is the instantaneous value of the input signal current, rather than employing the usual incremental definition $$\frac{\Delta i_L}{\Delta i_s}$$

is permissible since the initial load current is zero. Moreover, such an expression enables one to predict the total instantaneous load current for a given instantaneous input signal.

If the base current of transistor 301 is initially zero, but there is an initial load current through resistor 400, Equations 11 and 14 will still apply to define current-gain, provided the load current results from a greater $I_{CO}$ in transistor 303 than that of transistor 301, since the initial collector current of transistor 301 will be balanced out in the load for no signal applied (see Equation 9). In this instance, the expression for instantaneous load current will be as follows:

$$i_L=(I_{CO_2}-I_{CO_1})+i_s\left(\frac{\alpha}{1-\alpha}\right) \quad (23)$$

where $I_{CO_2}$ is the collector cut-off current of transistor 303 and $I_{CO_1}$ is the collector cut-off current of transistor 301. Practically speaking, the term ($I_{CO_2}-I_{CO_1}$) will always be very small.

To summarize, the current-gain expression $$\frac{\alpha}{1-\alpha}$$

for the present transistor D. C. amplifier circuit of this invention will be constant and predetermined and will be independent of changes in operating temperature. This arises because of the unique characteristics of the present circuit in cancelling out the effects of the temperature responsive component, $I_{CO}$, the collector cut-off current. The foregoing current-gain expression will apply if either the initial load current is maintained at zero, or the initial base current is maintained at zero, or both. Any one of these three conditions may be achieved by the adjustment of the voltage taps of potentiometer 500 (see Figure 5) to correct for dissimilarities in the amplification factor ($\alpha$) and collector cut-off current ($I_{CO}$) parameters of the two transistors chosen for use. This invention is applicable equally for N–P–N transistors.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A transistor amplifier exhibiting performance which is independent of operating temperature including, in combination, a plurality of transistors each having emitter, collector, and base terminals, coupling means providing a direct current path between said emitter terminal of a first of said plurality of transistors and said collector terminal of a second of said plurality of transistors, a plurality of input terminals, a first input terminal being directly coupled to said base terminal of said first transistor, an output load resistor directly coupled between said coupling means and a common reference potential, a first source of direct current voltage directly coupled to said base terminal of said second transistor, a second source of direct current voltage directly coupled to a second input terminal of said plurality of input terminals, said collector terminal of said first transistor being maintained at a direct current potential of a first polarity, and said emitter terminal of said second transistor being maintained at a direct current potential of opposite polarity but equal magnitude with reference to said common reference potential as said collector potential of said first transistor.

2. A transistor amplifier exhibiting performance which is independent of operating temperature including, in combination, a plurality of transistors each having emitter, collector, and base terminals, coupling means providing a direct current path between said emitter terminal of a first of said plurality of transistors and said collector terminal of a second of said plurality of transistors, a plurality of input terminals, a first input terminal being directly coupled to said base terminal of said first transistor, an output load resistor directly coupled between said coupling means and a common reference potential, a first source of variable direct current voltage directly coupled to said base terminal of said second transistor, a second source of variable direct current voltage directly coupled to a second input terminal of said plurality of input terminals, said collector terminal of said first transistor being maintained at a direct current potential of a first polarity, and said emitter terminal of said second transistor being maintained at a direct current potential of opposite polarity but equal magnitude with reference to said common reference potential as said collector potential of said first transistor.

3. A transistor amplifier exhibiting performance which is independent of operating temperature including, in combination: a plurality of transistors each having emitter, collector, and base terminals; coupling means providing a direct current path between said emitter terminal of a first of said plurality of transistors and said collector terminal of a second of said plurality of transistors; a plurality of input terminals, a first input terminal being directly coupled to said base terminal of said first transistor; an output load resistor directly coupled between said coupling means and a common reference potential; a variable rheostat having a first end-terminal directly coupled to said collector terminal of said first transistor, a second end-terminal directly coupled to said emitter terminal of said second transistor, a first variable tap directly coupled to said base terminal of said second transistor, and a second variable tap directly coupled to a second terminal of said plurality of said input terminals; said collector terminal of said first transistor being maintained at a direct current potential of a first polarity; and said emitter terminal of said second transistor being maintained at a direct current potential of opposite polarity but equal magnitude with reference to said common reference potential as said collector potential of said first transistor.

4. A transistor amplifier exhibiting performance which is substantially independent of operating temperature including, in combination, a plurality of transistors each having emitter, collector, and base terminals; coupling means providing a direct current path between said emitter terminal of a first of said plurality of transistors and said collector terminal of a second of said plurality of transistors; an input terminal directly coupled to said base terminal of said first transistor; voltage means provided with a first terminal exhibiting a common reference potential, a second terminal exhibiting a direct current potential of a first polarity, and a third terminal exhibiting a direct current potential which is of equal magnitude but of a second and opposite polarity to said potential exhibiting said first polarity; an output load impedance providing a direct current path and directly coupled between said coupling means and said first terminal of said voltage means; said collector terminal of said first transistor being directly coupled to said second terminal of said voltage means, said emitter terminal of said second transistor being directly coupled to said third terminal of said voltage means, and first and second means for biasing said base terminals of said first and second transistors, respectively.

5. A transistor amplifier exhibiting performance which is substantially independent of operating temperature including, in combination, a plurality of transistors each having emitter, collector, and base terminals; coupling means providing a direct current path between said emitter terminal of a first of said plurality of transistors and said collector terminal of a second of said plurality of transistors; an input terminal directly coupled to said base terminal of said first transistor; voltage means provided with a first terminal exhibiting a common reference potential, a second terminal exhibiting a direct current potential of a first polarity, and a third terminal exhibiting a direct current potential which is of equal magnitude but of a second and opposite polarity to said potential exhibiting said first polarity; an output load resistor directly coupled between said coupling means and said first terminal of said voltage means; said collector terminal of said first transistor being directly coupled to said second terminal of said voltage means, said emitter terminal of said second transistor being directly coupled to said third terminal of said voltage means, and first and second means for biasing said base terminals of said first and second transistors, respectively.

6. Apparatus according to claim 5 in which said second biasing means comprises means for balancing out quiescent emitter current of said first transistor through said output load resistor in the absence of an input signal impressed upon said input terminal.

7. Apparatus according to claim 6 in which said voltage means includes a potentiometer exhibiting said first, second, and third terminals, and in which said second biasing means includes a first movable tap mounted upon said potentiometer.

8. Apparatus according to claim 7 in which said first biasing means constitutes means for rendering said base electrode of said first transistor non-conductive in the absence of an input signal impressed upon said input terminal.

9. Apparatus according to claim 8 in which said first biasing means includes a second movable tap mounted upon said potentiometer.

References Cited in the file of this patent

UNITED STATES PATENTS

| | | |
|---|---|---|
| 2,070,071 | Strohmeyer | Feb. 9, 1937 |
| 2,662,124 | McMillan | Dec. 8, 1953 |
| 2,680,160 | Yaeger | June 1, 1954 |
| 2,730,576 | Caruthers | Jan. 10, 1956 |